United States Patent
Degen

(10) Patent No.: US 10,659,042 B2
(45) Date of Patent: May 19, 2020

(54) DEVICE HAVING AN OPTICALLY SENSITIVE INPUT ELEMENT

(71) Applicant: BIOVOTION AG, Zürich (CH)

(72) Inventor: Thomas Degen, Birmensdorf (CH)

(73) Assignee: Biovotion AG, Zurich (CH)

( * ) Notice: Subject to any disclaimer, the term of this patent is extended or adjusted under 35 U.S.C. 154(b) by 0 days.

(21) Appl. No.: 15/775,522

(22) PCT Filed: Nov. 13, 2015

(86) PCT No.: PCT/CH2015/000167
§ 371 (c)(1),
(2) Date: May 11, 2018

(87) PCT Pub. No.: WO2017/079850
PCT Pub. Date: May 18, 2017

(65) Prior Publication Data
US 2018/0351550 A1    Dec. 6, 2018

(51) Int. Cl.
*H03K 17/94*    (2006.01)
*G06F 3/042*    (2006.01)
*H03K 17/96*    (2006.01)

(52) U.S. Cl.
CPC .......... *H03K 17/941* (2013.01); *G06F 3/042* (2013.01); *H03K 17/9627* (2013.01); *H03K 2217/94106* (2013.01)

(58) Field of Classification Search
CPC .............. H03K 17/941; H03K 17/9627; H03K 2217/94106; H03K 17/94; G06F 3/042
See application file for complete search history.

(56) References Cited

U.S. PATENT DOCUMENTS

| | | | |
|---|---|---|---|
| 3,524,081 A | | 8/1970 | Campanella |
| 9,261,975 B2* | | 2/2016 | Miyake ................ G01B 11/002 |
| 2010/0097354 A1* | | 4/2010 | Ahn ...................... G06F 3/0412 |
| | | | 345/175 |
| 2011/0234302 A1 | | 9/2011 | Utsunomiya et al. |
| 2012/0242621 A1* | | 9/2012 | Brown ............. H01L 27/14623 |
| | | | 345/175 |
| 2013/0211204 A1 | | 8/2013 | Caduff et al. |

(Continued)

FOREIGN PATENT DOCUMENTS

| | | | |
|---|---|---|---|
| CH | 662 223 | 9/1987 | |
| CH | 662223 | * 9/1987 | ............. H02M 5/00 |
| WO | 2011/094875 | 8/2011 | |

OTHER PUBLICATIONS

International Search Report (ISR) and Written Opinion (WO) dated Jul. 25, 2016 for International Application No. PCT/CH2015/000167.

(Continued)

*Primary Examiner* — Vinh T Lam
(74) *Attorney, Agent, or Firm* — Ladas & Parry LLP

(57) ABSTRACT

The device has an input element, which can be used for resetting the device. The input element has at least one first photodiode arranged in series to at least one second photodiode. A voltage is applied over the photodiodes. When the user blocks light to only the second photodiode, the voltage at the interconnection between the photodiodes changes, which can be used to trigger the input element. The input element has low power consumption and high reliability.

19 Claims, 2 Drawing Sheets

(56) References Cited

U.S. PATENT DOCUMENTS

| | | | | |
|---|---|---|---|---|
| 2014/0103818 A1* | 4/2014 | Chen | ............... | H03K 17/133 |
| | | | | 315/159 |
| 2014/0104160 A1* | 4/2014 | Eriksson | ............ | G06F 3/042 |
| | | | | 345/156 |
| 2014/0246588 A1* | 9/2014 | Miyake | ............ | G01B 11/002 |
| | | | | 250/338.4 |
| 2015/0293645 A1* | 10/2015 | Zhou | ............... | G06F 3/0428 |
| | | | | 345/175 |
| 2016/0077668 A1* | 3/2016 | Schultz | ............ | G03B 21/58 |
| | | | | 345/175 |
| 2016/0328026 A1* | 11/2016 | Kang | ............... | G06F 3/0421 |
| 2018/0364868 A1* | 12/2018 | Otsubo | ............... | G06F 3/01 |

OTHER PUBLICATIONS

CH 662 223 _ Espacenet English Translation of the Abstract.

* cited by examiner

DEVICE HAVING AN OPTICALLY SENSITIVE INPUT ELEMENT

RELATED APPLICATION

This application is a national phase entry under 35 USC 371 of International Patent Application No.: PCT/CH2015/000167 filed on 13 Nov. 2015, the disclosure of which is incorporated herein by reference in their entirety.

TECHNICAL FIELD

The invention relates to a device comprising a housing and a user-operatable input element, and, in particular, to a device having an input element that has at least one photodiode.

BACKGROUND ART

In today's devices, interfaces become more and more important. They shall be reliable and low power. More and more so-called soft-keys are used, where the software of the device does adapt the function of the button. One exception is the hardware reset, which has to function without any software interference to be used as a last resort if a device becomes non-responsive.

It has been known to use photodiodes as input elements for electronic devices. Typically, the input element has to be covered by the user in order to operate it, thereby reducing the current through the photodiode, which can be detected by suitable circuitry.

DISCLOSURE OF THE INVENTION

It is a general object of the invention to provide a device of the type above with a simple, low-power input element.

This object is achieved by the device of claim 1. Accordingly, the device comprises a housing and a user-operatable input element. The input element comprises at least the following features:

A sensing circuit comprising at least one first photodiode and at least one second photodiode: This is the optically sensitive part of the input element. In the sensing circuit, the first photodiode is arranged in series to the second photodiode. It must be noted that there may be more than one first photodiode and/or more than one second photodiode. In that case all first photodiodes are advantageously arranged parallel to each other and all second photodiodes are advantageously arranged parallel to each other, even though it may also e.g. be possible to arrange e.g. two second photodiodes in series to each other.

A voltage source generating a voltage. This is advantageously a battery-based voltage source. The voltage from the voltage source is applied over said sensing circuit.

An amplifier having an input connected to an intermediate voltage potential at a location between the first photodiode and the second photodiode. This voltage potential is a function of the voltage applied over the sensing circuit and of the ratio between the conductance of the first photodiode and the conductance of the second photodiode.

The first photodiode and the second photodiode are spaced apart and are both arranged to receive ambient light through the housing, namely through separate areas of the housing. Hence, the user is able to block light from entering through only one of said areas, thereby influencing the ratio between the conductances of the first and the second photodiodes. Therefore, such blocking or unblocking can be detected by the amplifier circuit for generating a signal indicating that the user has operated the input element.

This design allows to provide a low-cost, waterproof, hardware-only input element.

The first photodiode or photodiodes has/have a total first responsivity and the second photodiode or photodiodes has/have a total second responsivity. The responsivity expresses the ratio of photocurrent to incident light power, e.g. expressed by A/W, advantageously integrated over the light spectrum of the sun after passing through the (at least semi-transparent) mentioned areas of the housing. The term "total" responsivity is meant to express that, if there is more than one first and/or one second photodiode, the responsivities of all first photodiodes are added for calculating the total first responsivity and the responsivities of all second photodiodes are added for calculating the total second responsivity.

Advantageously, the first total responsivity is smaller than the second total responsivity. In this case, for equal illumination of both areas of the housing, the intermediate voltage potential is below 50% or above 50% of the applied voltage (depending on where the second photodiodes are arranged). When the second photodiode(s) as/are blocked, the intermediate voltage level passes to 50% level of the applied voltage. This makes it easier to detect a user input. Advantageously, the first total responsivity is no more than 90%, in particular no more than 50% of the second responsivity, which leads (at uniform illumination) to an intermediate voltage potential well away from the 50% level of the applied voltage. In particular, the photodiode with the lower current imposes its current onto the other.

In particular, there may be more second photodiodes than first photodiodes in order to achieve such a difference in total responsivity. In a simple embodiment, there is exactly one first photodiode and there are exactly two second photodiodes, all of which are of identical design, i.e. all of which have the same individual responsivities, such that the total second responsivity is twice the total first responsivity.

Alternatively, there can e.g. be only one first and only one second photodiode, with the first photodiode having a smaller individual responsivity than the second photodiode.

The first and the second areas through which the light is received by the photodiodes should be spaced apart such that at least one of them, namely the second area (i.e. the area feeding the light primarily to the second photodiode(s)) can be individually blocked and unblocked by the user. Advantageously, the center of the first area is at a distance of at least 0.5 cm, in particular of at least 1 cm, from the center of the second area.

On the other hand, the first and the second areas through which the light is received by the photodiodes should not be too far apart in order have similar light exposure if the user does not operate the input element. Advantageously, the center of the first area is at a distance of no more than 5 cm, in particular of no more than 2 cm, from the center of the second area.

Also, for similar reasons, both areas should be arranged at the same side, i.e. a common side, of the housing in order to have similar light exposure.

The device can be equipped with a fixation device, e.g. with a bracelet, strap or belt, adapted and structured for fixing the housing of the device against a human or animal body. In that case, the fixation device should be located such that the above-mentioned "common side" (which carries both of said areas) is facing the body. In this case, during operation, the currents through the photodiodes are at a minimum. In addition, the photodiodes can optionally be used for detecting the proper attachment of the device to the body.

The input element can be advantageously used as a "reset switch" because it requires a very low operating power and can be designed to function without software support. In other words, the device advantageously comprises a control unit, in particular a microprocessor, for controlling its operation, as well as a reset circuit for resetting the control unit, in which case the input element can form part of the reset circuit and trigger it.

Advantageously, the input of the amplifier is not directly connected to the location between the first and second photodiodes, but rather through a low-pass filter, thereby reducing the risk of inadvertently operating the input element.

Since the main purpose of the low-pass filter is to prevent signals caused by briefly blocking the light to the second photodiode, the filter advantageously comprises a capacitor and an "asymmetric resistor". The asymmetric resistor is arranged between the capacitor and said location between the first and second photodiodes, and it is oriented to have a higher conductivity for current flowing through the second photodiode than for current flowing through the first photodiode. In that case, the capacitor is quickly reset to its default charge after the user unblocks the light passage to the second photodiode(s).

BRIEF DESCRIPTION OF THE DRAWINGS

The invention will be better understood and objects other than those set forth above will become apparent when consideration is given to the following detailed description thereof. This description makes reference to the annexed drawings, wherein.

MODES FOR CARRYING OUT THE INVENTION

Figure 1:
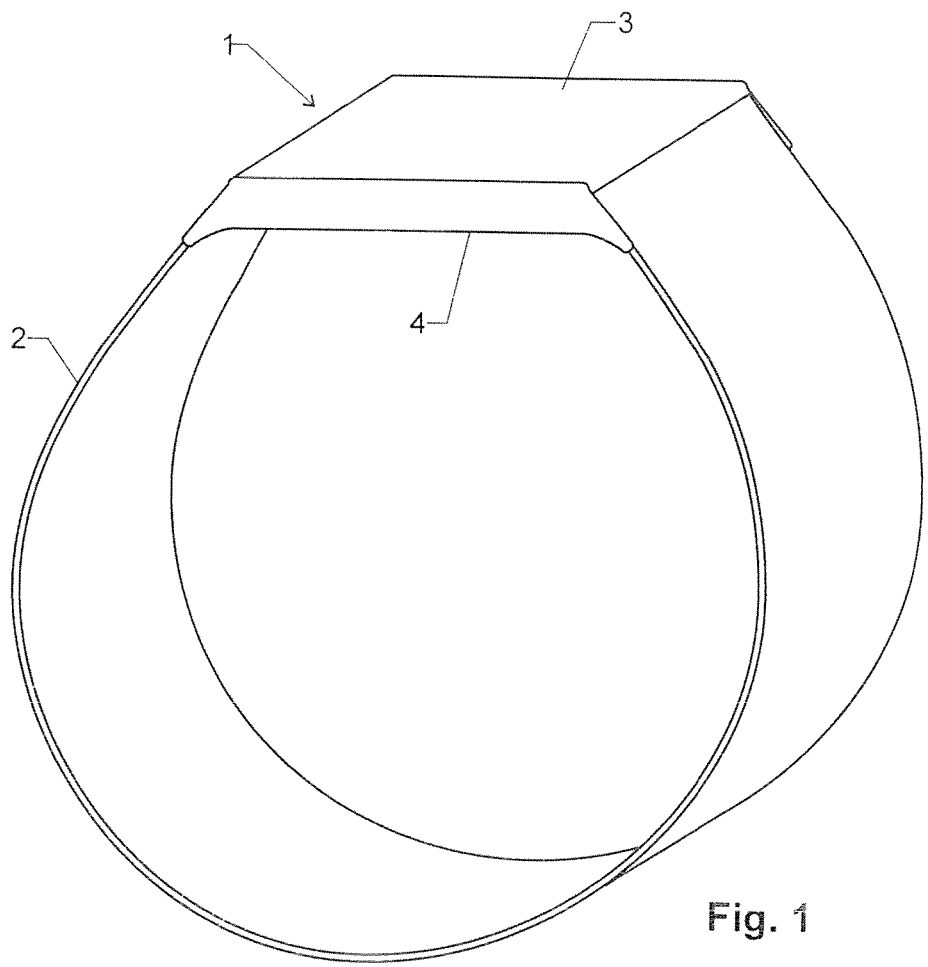
FIG. 1 shows an example of a device comprising a user-operatable input element.
Figure 2:
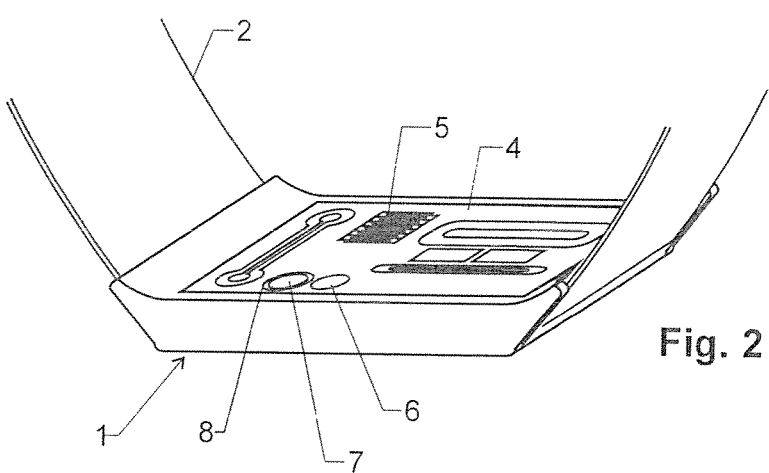
FIG. 2 shows a second view of the device of FIG. 1.

The device of FIGS. 1 and 2 is advantageously a device that a user wears on his body. It can e.g. be a health monitoring device, a wristwatch, a wearable computer, etc.

The device comprises a housing 1 and a fixation device 2. Fixation device 2 is typically a wristband, belt or strap to be wound around a body part, thereby affixing housing 1 to the body part in a defined position.

Housing 2 comprises an outer surface 3 and an inner surface 4. The device is structured such that, when it is attached to the user's body by means of fixation device 2, outer surface 3 faces away from the body, while inner surface 4 is facing the body.

For reasons that will become apparent below, inner surface 4 is also called the "common surface" of housing 1. In the embodiment shown, inner surface 4 carries a variety of sensors 5 for monitoring physiological parameters of the user. An example of a device with such sensors is disclosed in WO2011094875.

A first and a second window 6, 7 are arranged on inner surface 4. These windows are advantageously transparent (in particular with a transparency of at least 50%) over at least a subrange of wavelengths between 400 and 2000 nm.

Both windows 6, 7 are arranged on the same side of the housing, in the present embodiment on the inner or common surface 4 of the housing.

Advantageously, the two windows 6, 7 have different visual appearance in order to provide a clear distinction to the user. For example, the first window 6 can be unframed, while the second window 7 is marked by means of a frame 8, e.g. formed by a differently colored section of the housing's surface.

Figure 3:
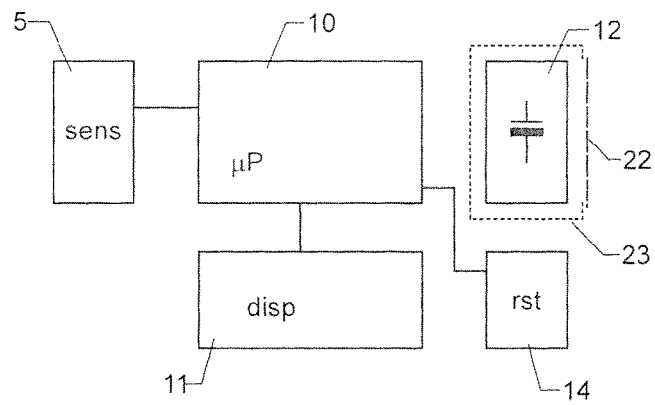
FIG. 3 shows a block diagram of the device.

FIG. 3 shows a block diagram of the components of the device. Typically, these components are arranged within housing 1, although some of them may also be located outside housing 1.

The components include a control unit 10, which can e.g. be formed by a microprocessor and further storage and/or control circuitry. Further, and as mentioned, the device comprises the sensors 5, which are connected to control unit 10 by means of suitable interface circuitry. The device may also comprise a display 11, if required. A battery 12 supplies the components with electrical energy.

The device further comprises a reset circuit 14 for resetting control unit 10. The process of "resetting" is known to the skilled person. It typically brings a control unit into a defined state, typically the same state that it has immediately after being connected to power, from where it can start-up itself under the control of its firmware. A reset circuit is typically provided for restarting the device, e.g. after a malfunction.

Figure 4:
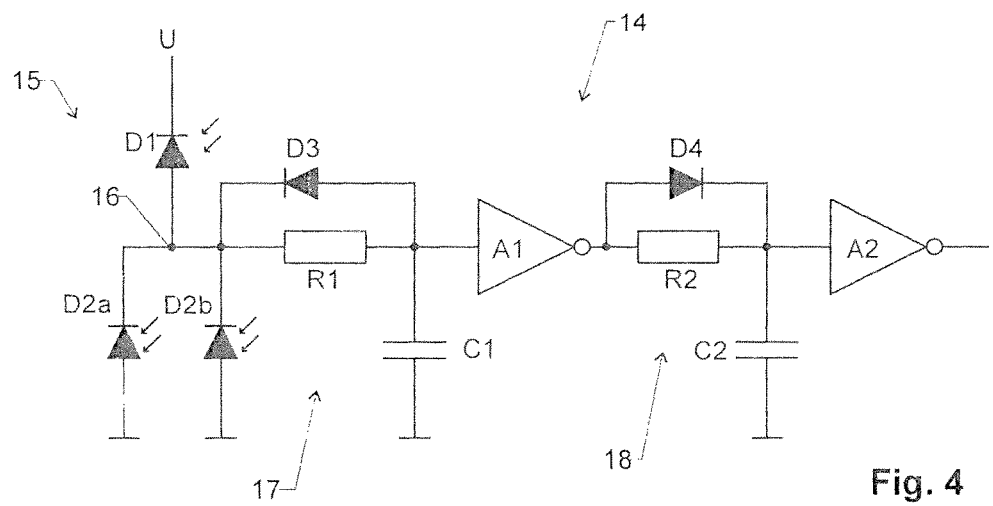
FIG. 4 shows a circuit diagram for some components of the user-operatable input element.

Some of the components of reset circuit 14 are shown in FIG. 4.

In the present embodiment, reset circuit 14 comprises a sensing circuit 15 with a first photodiode D1 and two second photodiodes D2*a*, D2*b*. The second photodiodes D2*a*, D2*b* are arranged in parallel to each other. The first photodiode D1 is arranged in series with the two second photodiodes D2*a*, D2*b*. A voltage U, which is typically in a range between 1 and 20 V, e.g. 3.3. V, is applied over sensing circuit 15. The cathodes of the photodiodes face the positive side of the applied voltage, i.e. the diodes are in blocking mode, and current only flows through them when the photodiodes are exposed to light.

The first photodiode D1 is arranged behind first window 6 of housing 1 (see FIG. 2), while the second photodiodes D2*a*, D2*b* are arranged behind second window 7 of housing 1. In other words, first window 6 forms a first area of the housing through which light is impinging on the first photodiode(s), while second window 7 forms a second area of the housing through which light is impinging on the second photodiode(s).

In the shown embodiment, all the photodiodes are of the same design. Hence, the combination of the two second photodiodes D2*a*, D2*b* has higher total responsivity than the single first photodiode D1. When the same amount of light passes through both windows 6, 7, the voltage at the location 16 between the first and the second photodiodes is substantially lower than 50% of the applied voltage U, irrespective of the absolute amount of ambient light. However, when the user places a finger on second window 7, but not on first window 6, thereby drastically reducing the current through the second photodiodes D2a, D2b, the voltage at location 16 will rise strongly.

A first low-pass filter 17 is connected to location 16. In the shown embodiment, it comprises a capacitor C1, one terminal of which is connected to a fixed potential (e.g. ground), while the other terminal is connected, via an ohmic resistor R1, to location 16. A diode D3 is arranged in parallel to resistor R1. Resistor R1 and diode D3 together form an asymmetric resistor that is oriented to have higher conductivity for current flowing through the second photodiodes D2a, D2b than for current flowing through first photodiode D1.

Hence, when the user blocks second window 7, but not first window 6, capacitor C1 will be slowly charged through resistor R1. However, when he unblocks second window 7, capacitor C1 will be quickly discharged through diode D3.

The time constant R1*C1 of first low-pass filter 17 when the second photodiodes are non-conducting is advantageously between 0.05 and 1 seconds.

The voltage over capacitor C1 is fed to the input of an amplifier A1. Advantageously, amplifier A1 is a binary amplifier (i.e. it is designed to have its output either at low or high level) with Schmitt-trigger input.

In the embodiment shown, amplifier A1 is an inverting amplifier.

The output of amplifier A1 is fed to a second low-pass filter 18 comprising e.g. a capacitor C2, an ohmic resistor R2 and a diode D4. Its design is basically the same as the one of first low-pass filter in the sense that diode D4 and resistor R2 are arranged in parallel for forming an asymmetric resistor that has high impedance when the light to the second photodiodes is blocked, while it has low impedance when light to the second photodiodes is unblocked. The time constant R2*C2 of second low-pass filter 18 when the second photodiodes are non-conducting is advantageously between 1 and 5 seconds.

The output of second low-pass filter 18 is fed to a second amplifier A2. Advantageously, second amplifier A2 is again a binary amplifier with Schmitt-trigger input. In the embodiment of FIG. 4, it is an inverting amplifier.

The output of second amplifier A2 is used for resetting control unit 10.

As it will be apparent to the skilled person, when the user blocks light to the second photodiodes D2a, D2b, but not to the first photodiode D1, the output of first amplifier A1 will switch from 1 to 0 after e.g. 0.05 and 1 seconds, and the output of second amplifier A2 will switch from 0 to 1 after another 1 to 5 seconds, whereupon control unit 10 is reset.

For the basic function of the device, the diodes D3 and D4 are not essential. However, if the user unblocks the light before the reset process is complete, the capacitors C1 and C2 will be quickly discharged through the diodes D3 and D4, respectively, and the reset circuit will be quickly ready for a new resetting process.

Figure 5:
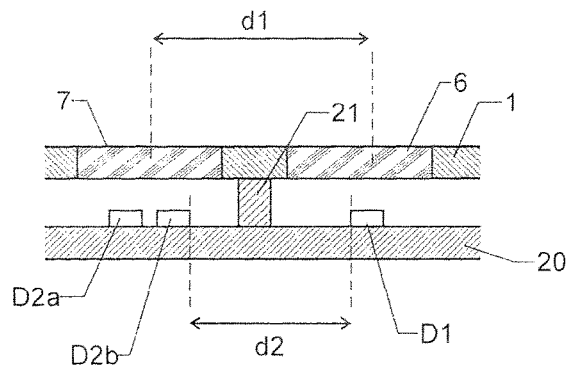
FIG. 5 is a sectional view of part of the housing with two windows and the photodiodes behind them, and FIG. 6 another embodiment of the device with a light shielding cover over the second photodiode(s).

FIG. 5 shows a sectional view of part of housing 1 with the windows 6, 7 and the photodiodes D1, D2a, D2b behind them.

In the embodiment shown, the photodiodes D1, D2a, D2b are mounted to a circuit board 20, with the first photodiode D1 behind first window 6 and the second photodiodes D2a, D2b behind second window 7.

For easy operation of the device, the windows 6, 7 should be sufficiently large, with their centers e.g. being spaced apart by a distance d1 of at least 0.5 cm, in particular at least 1 cm.

On the other hand, and as mentioned above, the windows 6, 7 should not be too far apart in order to receive the same amount of light if the user blocks none of them, hence the distance d1 between their centers is advantageously no more than 5 cm, in particular no more than 2 cm.

Instead of using two separate windows 6, 7, a single, larger window can be used, with the first and second photodiodes being located behind it. However, in any case, the first and the second photodiode should be spaced apart and arranged to receive ambient light at least in part through separate areas of the housing such that the user can selectively block the light (or at least a substantial part thereof) to the second photodiodes.

In other words, the housing can be provided with at least one window. The photodiodes are arranged behind this at least one window, i.e. they are positioned to receive light through the window or windows. Advantageously, the housing comprises a first window 6 and a second window 7, with the first photodiode(s) D1 arranged behind the first window 6 and the second photodiode(s) D2a, D2b arranged behind the second window 7.

The separate areas of the housing, i.e. the windows 6, 7 in the embodiment of FIG. 2, through which the first and the second photodiodes D1, D2a, D2b receive ambient light, are (as already mentioned) advantageously provided with at least one visually perceptible marking, e.g. frame 8 in the embodiment of FIG. 2, such that the user can distinguish between them.

The separate areas of the housing are not necessarily different from the rest of the housing 1. For example, if the housing is transparent for a wavelength where the photodiodes are sensitive, no dedicated windows are required. For example, the housing may be transparent for infrared light of 1 or 2 μm, and photodiodes sensitive at that spectral range can be used.

Advantageously, the physical distance d2 between the first and the second photodiodes should be at least 0.5 cm, in particular of at least 1 cm, which makes it easier to design a device where the user can block only the second photodiodes.

As can also be seen in FIG. 5, the device can comprise a shield 21 that optically separates the first and second photodiodes D1, D2a, D2b. It prevents light entering through first area (first window) 6 from reaching the second photodiode(s) D2a, D2b, and it prevents light entering through second area (second window) 7 from reaching said first photodiode(s) D1. This design improves the sensitivity of the device.

Figure 6:
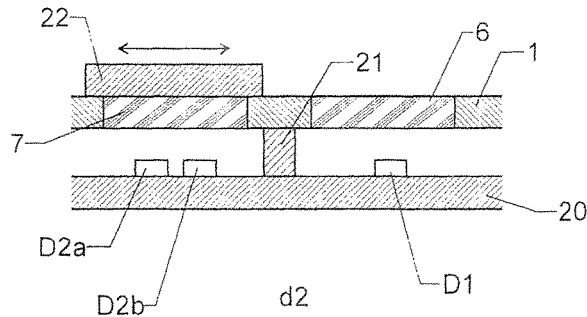

FIG. 6 shows a further embodiment of the invention. In the above examples, it was assumed that the user covers the second photodiode(s) in order to activate the input element and releases the cover for deactivating the input element. The opposite works, too, i.e. the second photodiode can be obscured by a non-transparent cover 22 by default and the input element is activated by removing that cover. "Non-transparent" in this context means that cover 22 blocks a sufficient amount of light, advantageously at least 50%, in particular at least 90% of the light (in the sensitive spectrum of the photodiode) from reaching the photodiode in order to give rise to a detectable voltage change.

This design can be used to detect the cover 22 being moved. It works under all conditions (except pitch dark), and it can advantageously be used if the photodiodes are on the back of the housing, i.e. on the side facing away from the body.

Cover 22 is advantageously affixed to housing 1 and is moveable thereto or (non-destructively) reversely removable therefrom. For example, cover 22 can be attached to housing 1 in slideable manner.

In one implementation, the second photodiode(s) D2a, D2b could be arranged to receive light through a battery compartment 23 of the housing (cf. FIG. 3), and cover 22 can form the lid of the battery compartment. Second window 7 opens into battery compartment 23. The input element can then be activated by opening the battery compartment, i.e. be moving or removing cover 22. If the input element is, as in the example above, designed to reset the device, the device can then be reset by removing the lid of the battery compartment. This can e.g. be used to ensure as reset before the battery is removed or as a protection against foreseeable misuse.

The technique described here can also be used to detect when a device is unpacked, e.g. by making cover 22 part of a packaging of the device.

Notes:

By making use of photodiodes, the present design implements a hardware-only reset functionality with a very low power consumption (0.2 µA) while not using any external components. The only drawback is that the circuit requires ambient light to work. This disadvantage is alleviated by the fact that there is rarely a need to reset a device in absolute darkness.

The circuit compares the current of the first and the second photodiodes, which are placed in series. One photodiode is made larger, i.e. more responsive (e.g. by placing two diodes in parallel or by using a single diode with a larger junction) so that the in all lightning conditions the photodiode with the higher current squelches the smaller photodiode. The resulting voltage drop over the squelched photodiode is close to zero. This voltage drop is sensed via a passive RC element and, if the larger photodiode is obscured long enough while the smaller photodiode is not, the circuit will generate a reset signal. The only current required is the bias current of the sensing inverter (i.e., 0.2 µA).

Another way of describing the action is to imagine two current sources in series. The current source with the smaller current then forces the operating voltage over the second current source to settle at the corresponding operating point in the voltage-to-current diagram, which is very close to zero volt. The smaller current source literally squelches the second one. This happens for far less than 50% of difference in responsivity (depending on the steepness of the voltage-to-current diagram). A perfect current source will not allow any difference at all.

As can be seen from the figures, the first and second photodiodes are oriented with the same polarities, i.e. with the cathode facing the positive voltage side. In other words, the photodiodes are polarized in "reverse direction", i.e. in a direction where no current flows in the absence of light.

In the above example, there is a single first photodiode D1 and there are two second photodiodes D2a, D2b. However, and as mentioned above, the two second photodiodes D2a, D2b can e.g. be replaced by a single photodiode with higher responsivity than first photodiode D1.

Also, the locations of the first and second photodiodes may be swapped in FIG. 4, i.e. the first photodiode D1 is arranged between ground and location 16, while the second photodiodes D2a, D2b are arranged between location 16 and voltage U. In that case, the polarity of the diodes D3 and D4 should be reversed.

As mentioned, the input element is advantageously used for resetting the device. However, it can also be used for controlling other operations of the device, e.g. in particular for switching the device off or on.

While there are shown and described presently preferred embodiments of the invention, it is to be distinctly understood that the invention is not limited thereto but may be otherwise variously embodied and practiced within the scope of the following claims.

The invention claimed is:

1. A device comprising a housing (1) and a user-operatable input element (14), wherein said input element (14) comprises at least one photodiode (D1, D2a, D2b), characterized in that said input element (14) comprises
  a sensing circuit (15) comprising at least one first photo-diode (D1) and at least one second photo-diode (D2a, D2b), wherein said first photodiode (D1) is arranged in series to said second photodiode (D2a, D2b), a voltage source (12) generating a voltage, wherein said voltage is applied over said sensing circuit (15),
  an amplifier (A1) having an input connected to an intermediate voltage potential at a location (16) between said first photodiode (D1) and said second photodiode (D2a, D2b),
  wherein said first photodiode (D1) and said second photodiode (D2a, D2b) are spaced apart and are arranged to receive ambient light at least in part through first and second separate areas (6, 7) of said housing (1); and
  wherein the input of said amplifier is connected via a low-pass filter (17) to a location (16) between the first photodiode (DI) and the second photodiode (D2a, D2b), said low-pass filter (17) comprising a capacitor (CI) and an asymmetric resistor (R1, D3), wherein said asymmetric resister (R1,D3) is arranged between said capacitor (CI) and said location (16) and is oriented to have a higher conductivity for current flowing through said second photodiode (D2a, D2b) than for current flowing through said first photodiode (DI).

2. The device of claim 1 wherein said first photodiode (D1) or photodiodes has/have a total first responsivity and said second photodiode (D2a, D2b) or photodiodes has/have a total second responsivity, wherein said first responsivity is smaller than said second responsivity, in particular wherein, said first responsivity is no more than 50% of said second responsivity.

3. The device of claim 1, wherein there are more second photodiodes (D2a, D2b) than first photodiodes (D1).

4. The device of claim 1, wherein there is one first photodiode (D1) and there are two second photodiodes (D2a, D2b), wherein said photodiodes are of identical design.

5. The device of claim 1, wherein there is exactly one first and exactly one second photodiode (D2a, D2b), with the first photodiode (D1) having a smaller individual responsivity than the second photodiode (D2a, D2b).

6. The device of claim 1, wherein a center of said first area (6) is at a distance of at least 0.5 cm, in particular of at least 1 cm, from a center of said second area (7).

7. The device of claim 1, wherein a center of said first area (6) is at a distance of no more than 5 cm, in particular of no more than 2 cm, from a center of said second area (7).

8. The device of claim 1, wherein said first area (6) and said second area (7) are arranged on a common side of the housing (1).

9. The device of claim 8 comprising a fixation device for fixing said housing (1) against a human or animal body with said common side facing said body.

10. The device of claim 1, further comprising a control unit (10) for controlling an operation of the device as well as a reset circuit for resetting said control unit, wherein said reset circuit comprises said input element (14) for triggering a reset.

11. The device of claim 1, wherein said first photodiode (D1) is at a distance of at least 0.5 cm, in particular of at least 1 cm, from a said second photodiode (D2a, D2b).

12. The device of claim 1, wherein said asymmetric resistor comprises an ohmic resistor and a diode, arranged in parallel to each other.

13. The device of claim 1, wherein said housing (1) comprises at least one window, wherein said photodiodes (D1; D2a, D2b) are located behind said at least one window.

14. The device of claim 13, wherein said housing (1) comprises a first window and a second window, with said at least one first photodiode (D1) located behind the first window and said at least one second photodiode (D2a, D2b) arranged behind the second window.

15. The device of claim 1, wherein said separate areas (6, 7) of the housing are provided with at least one visually perceptible marking (8) allowing a user to distinguish between them.

16. The device of claim 1, further comprising a shield (21) optically separating said first and said second photodiodes (D1, D2a, D2b) and preventing light entering through said first area (6) from reaching said at least one second photodiode (D2a, D2b) and for preventing light entering through said second area (7) from reaching said at least one first photo-diode (D1).

17. The device of claim 1, further comprising a non-transparent cover (22) for preventing light from reaching said at least one second photodiode (D2a, D2b).

18. The device of claim 17, where in said cover (22) is affixed to said housing (1) and moveable in respect to said housing (1) or reversely removable from said housing (1).

19. The device of claim 17, wherein said housing (1) comprises a battery compartment (23) and wherein said cover (22) forms a lid of said battery compartment (23).

\* \* \* \* \*